United States Patent
Yoshioka et al.

(10) Patent No.: US 6,634,245 B1
(45) Date of Patent: Oct. 21, 2003

(54) DRIVINGLY ROTATABLE MECHANISM OF SPECIMEN LOADING TABLE AND SPECIMEN LOADING MECHANISM

(75) Inventors: Haruhiko Yoshioka, Higashiyamanashi-gun (JP); Shinji Iino, Kitakoma-gun (JP); Yutaka Akaike, Nishiyatsushiro-gun (JP); Masaru Suzuki, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/646,124

(22) PCT Filed: Jan. 25, 2000

(86) PCT No.: PCT/JP00/00357
§ 371 (c)(1),
(2), (4) Date: Sep. 28, 2000

(87) PCT Pub. No.: WO00/45432
PCT Pub. Date: Aug. 3, 2000

(30) Foreign Application Priority Data

Jan. 29, 1999 (JP) .............................. 11-021178
Jul. 9, 1999 (JP) .............................. 11-196113

(51) Int. Cl.[7] .......................... G01M 19/00; G01R 31/26
(52) U.S. Cl. ...................... 73/865.8; 73/865.9; 324/765
(58) Field of Search .......................... 73/865.7, 866.5, 73/865.8; 324/765, 758

(56) References Cited

U.S. PATENT DOCUMENTS

| | | | | |
|---|---|---|---|---|
| 1,598,170 A | * | 8/1926 | Stuart et al. ................ | 413/30 |
| 1,797,173 A | * | 3/1931 | Metson ........................ | 53/528 |
| 2,968,517 A | * | 1/1961 | Daugherty et al. ............ | 158/7 |
| 3,446,065 A | * | 5/1969 | Wiesler et al. ................ | 73/105 |
| 4,556,317 A | * | 12/1985 | Sandland et al. ........ | 356/237.1 |
| 4,812,901 A | * | 3/1989 | Karasawa ................... | 348/126 |
| 4,938,654 A | * | 7/1990 | Schram ...................... | 414/757 |
| 5,198,752 A | * | 3/1993 | Miyata et al. .............. | 324/760 |
| 5,656,942 A | * | 8/1997 | Watts et al. ................. | 324/754 |
| 6,140,828 A | * | 10/2000 | Iino et al. .................... | 324/758 |
| 6,435,045 B1 | * | 8/2002 | Chen et al. ................. | 73/866.5 |

FOREIGN PATENT DOCUMENTS

| | | | | |
|---|---|---|---|---|
| JP | 4-37712 | * | 2/1992 | ................... 349/84 |
| JP | 7-312383 | | 11/1995 | ........... H01L/21/66 |
| JP | 10-163299 | | 6/1998 | ........... H01L/21/66 |
| JP | 10-282147 | * | 10/1998 | ............ G01R/1/73 |
| JP | 11-26524 | | 1/1999 | ........... H01L/21/66 |

OTHER PUBLICATIONS

TDB-ACC-No: NN 890294 "Chuck for Automatic Wafer Processing," IBT Technical Disclosure Bulletin, Feb. 1989, Vol. 31, No. 9, pp. 94–95.*

* cited by examiner

*Primary Examiner*—Thomas P. Noland
(74) *Attorney, Agent, or Firm*—Oblon, Spivak, McClelland, Maier & Neustadt, P.C.

(57) ABSTRACT

A rotating mechanism 18 according to the present invention is a mechanism for reversibly rotating a chuck top 11, on which a wafer to be inspected is mounted. The rotating mechanism is provided with a linearly driving mechanism 181 arranged on one side of the chuck top 11, a nut 182 which is linearly moved by the linearly driving mechanism, a guide rail 183A for linearly guiding the nut 182, and a link mechanism 184 for coupling the nut 182, which moves along the guide rail 183A, to the chuck top 11.

13 Claims, 6 Drawing Sheets

DRIVINGLY ROTATABLE MECHANISM OF SPECIMEN LOADING TABLE AND SPECIMEN LOADING MECHANISM

BACKGROUND OF THE INVENTION

1. Field of the Invention

The present invention relates to a mechanism for rotating a chuck top on which an object to be inspected is mounted and to a mount mechanism on which the object is mounted. More specifically, the present invention relates to a rotating mechanism and an object mount mechanism which reliably prevents the chuck top from being shifted in the θ direction, and which reliably prevents an inspection probe needle from being shifted from the right inspection position on the object.

2. Discussion of the Background

Figure 7:
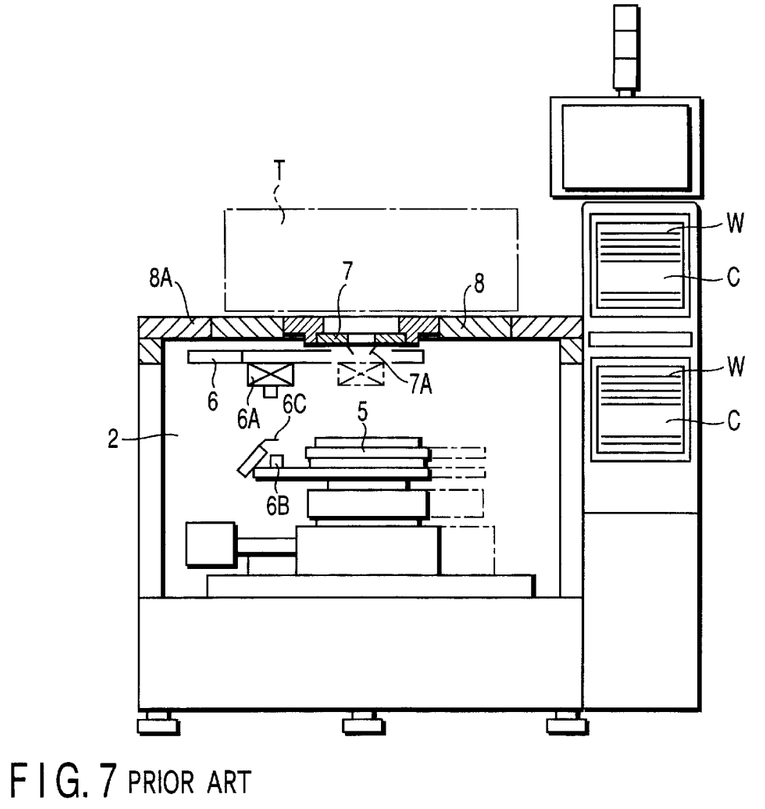
FIG. 7 illustrates a conventional probing, and is a front view showing the probing chamber, with its front portion being cut away.
Figure 8:
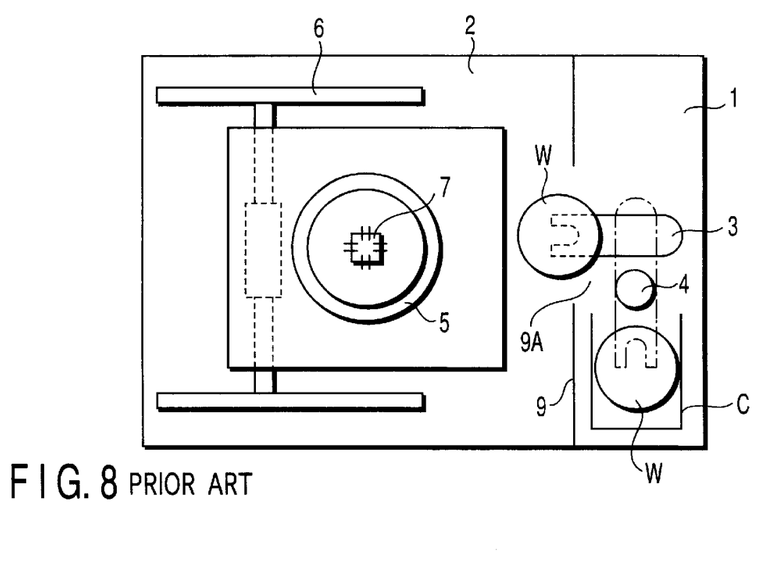
FIG. 8 is a plan view of the probing shown in FIG. 7.

A conventional probing apparatus for inspecting the electrical characteristics of integrated circuits (ICs) formed on a semiconductor wafer (hereinafter referred to as a wafer) is provided with a loading chamber 1 and a probing chamber 2, as shown in FIGS. 7 and 8. The loading chamber 1 is a chamber through which the wafer w is transported for pre-alignment, and the probing chamber 2 is a chamber in which the electrical characteristics of the IC formed on the wafer W transported from the loading chamber 1 are inspected. As shown in FIG. 8, a tweezers 3 and a subchuck 4, which jointly constitute a transport mechanism, are arranged in the loading chamber 1. The wafer w is transported by the trawzeers 3 and is pre-aligned on a sub-chuck 4 with reference to an orientation flat or a notch. Arranged inside the probing chamber 2 are a main chuck 5 on which the wafer w to be inspected is mounted, and an alignment mechanism 6 which is provided with a vertically-movable camera. Under the alignment mechanism 6, the main chuck 5 is moved in the X, Y, Z and θ directions, so that the electrodes of the ICs formed on the wafer W are aligned with the probe needles 7A of a probe card 7. After the alignment, the electrical characteristics of the IC are inspected by a test head T in the state where the electrodes of the IC formed on the wafer of the main chuck 5 are kept in electric contact with the probe needles 7A. The main chuck 5 contains a temperature-adjusting mechanism. By this mechanism the temperature of the wafer W is kept in a relatively wide range (e.g., −50° C. to +160° C.), and a normal-temperature test, a low-temperature test, and a high-temperature test are conducted.

When the electrical characteristics of ICs formed on the wafer W are inspected, the wafer w is placed on the main chuck 5, and the temperature of this main chuck 5 is kept at a predetermined value by the temperature-adjusting mechanism. By the alignment mechanism 6, the electrodes of the ICs formed on the wafer W are aligned with the probe needles 7A. Thereafter, the main chuck 5 is raised in the Z direction until the electrode pads of the ICs formed on the wafer W are brought into electric contact with the probe needles 7A. In this state, the electrical characteristics of the ICs are inspected by the test head T. The probe card 7 is removably provided on a head plate 8, which is a top plate of the probing chamber 2.

Figure 9:
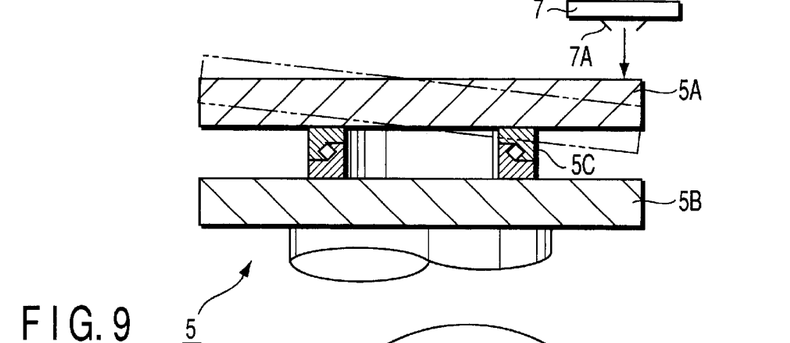
FIG. 9 is a sectional view showing part of the mount mechanism of the probing depicted in FIG. 7.

As shown in FIG. 9, the main chuck 5 is provided with: a chuck top 5A, a support table 5B for supporting the chuck top 5A, and a ring-like bearing 5C arranged between the chuck top 5A and the support table 5B and having a cross roller. By means of a rotating mechanism shown in FIGS. 10 and 11, the chuck top 5A is rotatable on the support table 5B, with the bearing 5C interposed. It is rotatable in the θ direction normally and reversely. The rotating mechanism 8, 9, which is shown in FIGS. 10 and 11, is coupled to the chuck top 5A of the main chuck 5, and the chuck top 5A is rotated in the θ direction normally and reversely.

Figure 10:
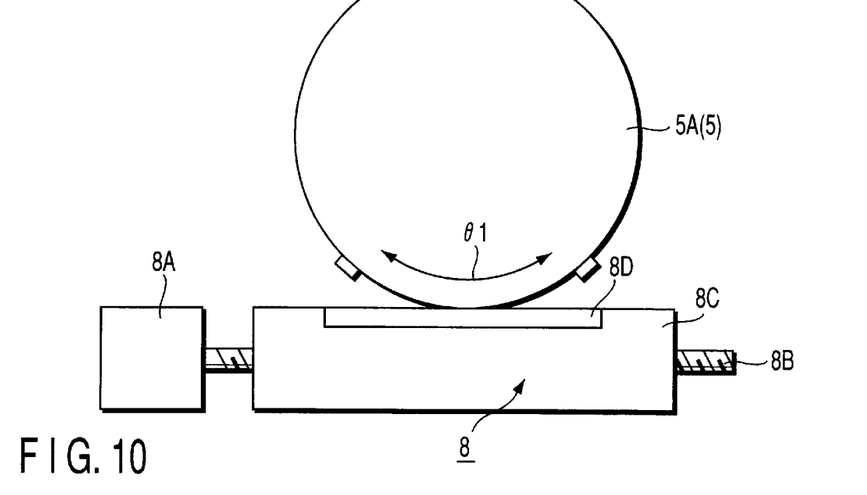
FIG. 10 is a plan view showing an example of a rotating mechanism of the related art.

The rotating mechanism 8 shown in FIG. 10 includes a motor 8A, a ball screw 8B coupled to the motor 8A, a nut 8C which is in engagement with the ball screw 8B, and a belt 8D which connects the nut 8C and the chuck top 5A in a crossed state. The rotating mechanism 8 rotates the chuck top 5A by means of the belt 8D in accordance with the movement of the nut 8C, and the chuck top 5A is rotated normally and reversely in the direction indicated by arrow θ1.

Figure 11:
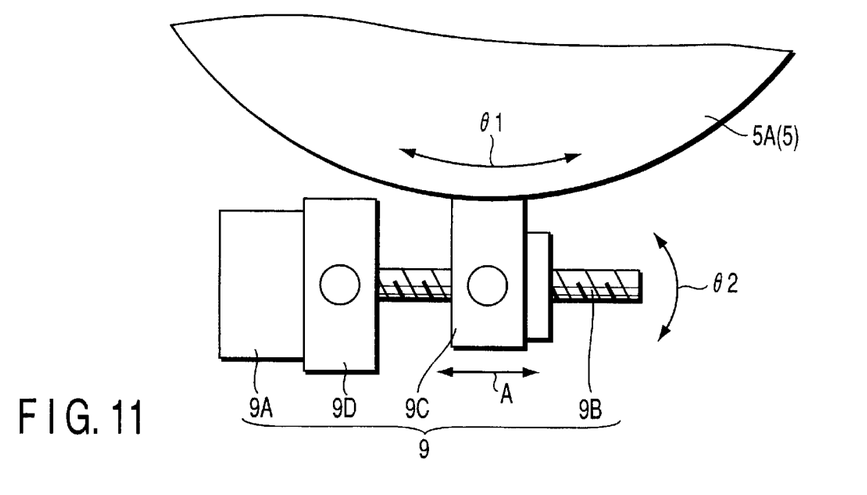
FIG. 11 is a plan view showing another example of a rotating mechanism of the related art.

The rotating mechanism shown in FIG. 11 includes a motor 9A, a ball screw 9B coupled to the motor 9A, a nut 9C which is in engagement with the ball screw 9B and coupled to the chuck top 5A, and a support member 9D for supporting the ball screw 9B. When the ball screw 9B is rotated, the nut 9C moves in the A directions. In accordance with this movement of the nut 9C, the chuck top 5A is rotated normally and reversely in the direction indicated by arrow θ1.

SUMMARY OF THE INVENTION

In accordance with the development of ultrafine integrated circuits formed on semiconductor wafer, electrode pads are arranged at narrower pitches, and the number of ICs measured at a time is increasingly large. Under the circumstances, the number of probe needles 7A used in the measurement is increasingly large. Due to the use of a large number of probe needles 7A, the total pressure exerted on the semiconductor wafer through the probe needles 7A is very high since the pressure exerted on an electrode pad of the semiconductor wafer by one probe remains the same. In particular, when an ICs formed on the periphery of a wafer W is inspected, a needle pressure as large as several kg is applied to the chuck top 5A as an eccentric load, as indicated by the arrow in FIG. 9. In general, the outer diameter of the ring-like bearing 5C is very small in comparison with the outer diameter of the chuck top 5A or support table 5C, and there is a gap in the areas outward of the ring-like bearing 5C. The eccentric load exerted on the chuck top 5A elastically deforms the bearing though slightly, and the chuck top 5A slants, as indicated exaggeratedly with the one-dot-dash line in FIG. 5A. As a result, the probe needles 7A are shifted from the desirable alignment positions, and the reliability of the inspection is significantly lowered.

Where the wafer size is large in diameter, the distance between the center of the main chuck 5 and the point of action is long in comparison with the corresponding distance of the prior art, thus resulting in a more marked slant of the main chuck 5. In addition, the pressures applied from the probe needles 7A may significantly differ, and some of the probe needles 7A may not be in contact with the electrode pads of the ICs formed on the wafer W. Thus, the reliability of the inspection is markedly degraded.

The rotating mechanism 8 shown in FIG. 10 is coupled to the chuck top 5A by means of the belt 8D. With this structure, the chuck top 5A is not very rigid in the θ1 direction. When the main chuck 5 is overdriven, the eccentric load which is applied to the chuck top 5A when the wafer and the probe needles are brought into contact rotates the chuck top in the θ direction, resulting in a positional shift. By this positional shift, the reliability of the inspection is adversely affected.

In the rotating mechanism 9 shown in FIG. 11, the ball screw 9B swings in the θ2 direction with the support member 9D as a center. With this structure, the rotating mechanism 9 is not very rigid in the θ2 direction, and extra space is needed for the ball screw 9B to swing. At the present time, more and more ultrafine chips are developed, and more and more large-diameter wafers are developed. Under the circumstances, there is an urgent demand for a solution to the above problems.

To solve the problems described above, the present invention is intended to provide a mechanism for mounting an object to be inspected, which enables the main chuck to be kept in the horizontal state at all times, even if an eccentric load is exerted in the neighborhood of the outer periphery of the chuck top, thereby enhancing the reliability of the inspection.

The present invention is also intended to provide a rotating mechanism and an object mount mechanism which provide an increased rigidity in the θ direction when the probe needles are brought into contact and which reliably prevent the chuck top from being rotated in the θ direction.

In accordance with the first aspect of the present invention, there is provided a rotating mechanism comprising:

a movable body;

a linearly driving mechanism including a driving shaft along which the movable body is linearly moved on a side of the chuck top by a driving force of a motor;

a guide mechanism including a guide rail for linearly guiding the movable body; and a coupling mechanism for coupling the movable body and the chuck top together and converting a linear motion of the movable body into a rotating motion of the chuck top, the rotating mechanism rotating the chuck top in normal and reverse directions, the chuck top being rotatably supported and holding an object to be inspected.

In the rotating mechanism, it is preferable that the driving shaft of the linearly driving mechanism be a ball screw, the movable body be provided with a through hole having a groove that is engageable with the ball screw, and the coupling mechanism be a link device connected to the chuck top and the movable body at respective ends.

In the rotating mechanism, it is preferable that the driving shaft of the linearly driving mechanism be a ball screw, the movable body be provided with a through hole having a groove that is engageable with the ball screw, and the coupling mechanism include a splined shaft having one end connected to the chuck top, a link device having one end connected to the other end of the splined shaft, and a support shaft coupled to the other end of the link device and standing upright on the movable body.

In the rotating mechanism, it is preferable that the guide rail be an LM guide that is engageable with the lower portion of the movable body.

In accordance with the second aspect of the present invention, there is provided a rotating mechanism comprising: a movable body; a linearly driving mechanism for linearly moving the movable body on a side of the chuck top; a guide mechanism for linearly guiding the movable body; and coupling means for coupling the movable body and the chuck top together and converting a linear motion of the movable body into a rotating motion of the chuck top, the rotating mechanism rotating the chuck top in normal and reverse directions, the chuck top being rotatably supported and holding an object to be inspected.

In accordance with the third aspect of the present invention, there is provided a mount mechanism for mounting an object to be inspected, comprising:

a chuck top on which the object is mounted;

a support table for supporting the chuck top to be rotatable in normal and reverse directions, the support table being provided with a vacuum suction mechanism having a vacuum exhaust passage which sucks and fixes the chuck top on the support table by a vacuum force;

a rotating mechanism for rotating the chuck top on the support table in normal and reverse directions; and a lift guide mechanism for guiding a vertical movement of the chuck top on the support table.

In the mount mechanism, it is preferable that the support table be provided with a lift mechanism that has a gas supply/exhaust passage. This passage is for enabling the chuck top to float away from the support table by utilization of a gas pressure, and for enabling the chuck top to land on the support table by releasing the gas pressure.

In the mount mechanism, it is also preferable that the vacuum suction mechanism include: a projected wall section arranged on the upper surface of the support table, being in contact with the lower surface of the chuck top, and defining a sealed space with reference to the upper surface of the support table and the lower surface of the chuck top; and a vacuum exhaust passage which is open in the upper surface of the support table at a position inside of the projected wall section, and that the lift mechanism include a projection formed on the upper surface of the support table, and an air supply passage which is open in the projection.

In the mount mechanism, it is preferable that a projection be provided in the neighborhood of the outer circumstance of the upper surface of the support table. The chuck top is landed on the projection when it is attracted by vacuum suction.

In the mount mechanism, it is preferable that at least one of the vacuum suction mechanism and lift mechanism be provided as the projection.

In the mount mechanism, it is preferable that the vacuum suction mechanism and the lift mechanism be arranged at equal intervals with respect to the circumferential direction of the support table.

In the mount mechanism, it is preferable that the lift guide mechanism include a shaft supported by one of the chuck top and the support table, and an engagement member secured to the other one of the chuck top and support table and being in engagement with the shaft in such a manner that the shaft is vertically movable.

In the mount mechanism, it is preferable that the lift guide mechanism include a splined shaft supported by one of the chuck top and the support table, and an engagement member secured to the other one of the chuck top and support table and being movable in engagement with the splined shaft.

In the mount mechanism, it is preferable that the rotating mechanism include: a movable body; a linearly driving mechanism for linearly moving the movable body on a side of the chuck top; a guide mechanism including a guide rail for linearly guiding the movable body; and coupling means for coupling the movable body and the chuck top together and converting a linear motion of the movable body into a rotating motion of the chuck top.

In the mount mechanism, it is preferable that the driving shaft of the rotating mechanism be a ball screw, the movable body of the rotating mechanism be provided with a through hole having a groove that is engageable with the ball screw, and the coupling mechanism of the rotating mechanism be a link device coupled to the chuck top and the movable body at respective ends.

In the mount mechanism, it is preferable that the driving shaft of the rotating mechanism be a ball screw, the movable body of the rotating mechanism be provided with a through hole having a groove that is engageable with the ball screw, and the coupling mechanism include a splined shaft having one end connected to the chuck top, a link device having one end connected to the other end of the splined shaft, and a support shaft coupled to the other end of the link device and standing upright on the movable body.

In the mount mechanism, it is preferable that the guide rail of the rotating mechanism be an LM guide that is engageable with the lower portion of the movable body.

In accordance with the fourth aspect of the present invention, there is provided a mount mechanism for mounting an object to be inspected, comprising:

mount means for mounting an object to be inspected;

support means for supporting the mount means to be rotatable in normal and reverse directions, the support means including a vacuum suction mechanism which sucks and fixes the mount means on the support means, and a lift mechanism for lifting the mount means away from the support means in a floating state;

a rotating mechanism for rotating the mount means on the support table in normal and reverse directions; and a lift guide mechanism for guiding a vertical movement of the chuck top on the support means.

In accordance with the fifth aspect of the present invention, there is provided an inspection apparatus for inspecting an integrated circuit formed on a semiconductor wafer, comprising:

a chuck top on which the semiconductor wafer is mounted;

a support table for supporting the chuck top to be rotatable in normal and reverse directions, the support table being provided with a vacuum suction mechanism which sucks and fixes the chuck top on the support table by a vacuum force, and a lift mechanism for lifting the chuck top away from the support table in a floating state, the vacuum suction mechanism including a projected wall section arranged on the upper surface of the support table, being in contact with the lower surface of the chuck top, and defining a sealed space with reference to the upper surface of the support table and the lower surface of the chuck top, and a vacuum exhaust passage which is open in the upper surface of the support table at a position inside of the projected wall section, the lift mechanism including a projection formed on the upper surface of the support table, and an air supply passage which is open in the projection; and a rotating mechanism for rotating the chuck top on the support table in normal and reverse directions, the rotating mechanism being provided with: a linearly driving mechanism including a ball screw which is rotated by a driving force of a motor on a side of the chuck top; a movable body being provided with a through hole having a groove that is engageable with the ball screw; a guide rail for linearly guiding the movable body; and a coupling mechanism including a splined shaft having one end connected to the chuck top, a link device having one end connected to the other end of the splined shaft, and a support shaft coupled to the other end of the link device and standing upright on the movable body.

BRIEF DESCRIPTION OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENTS

Figure 1:
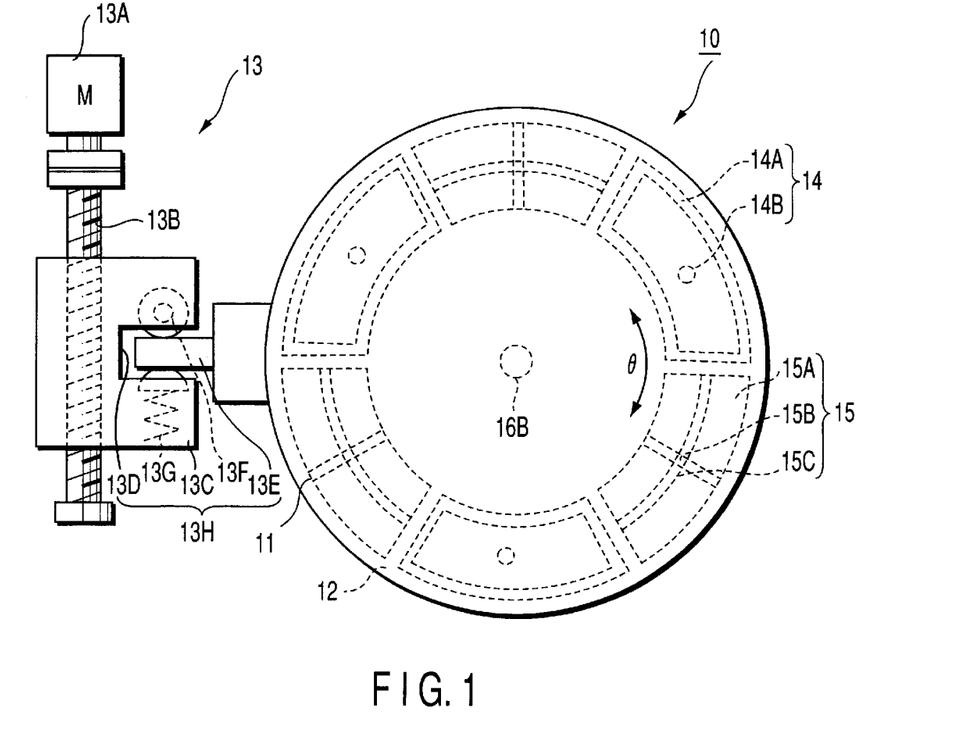
FIG. 1 is a plan view showing a mount mechanism according to one embodiment of the present invention.
Figure 2:
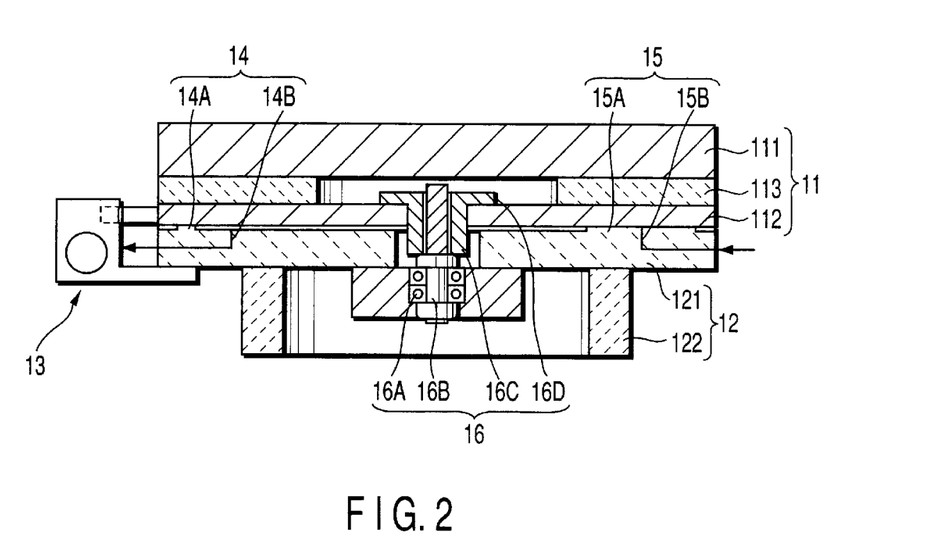
FIG. 2 is a sectional view of the mount mechanism shown in FIG. 1.

The present invention will be described, referring to the embodiment shown in FIGS. 1–6. A mechanism 10 on which an object to be inspected is mounted (which mechanism will be hereinafter referred to simply as a "mount mechanism") has such a structure as is shown in FIGS. 1 and 2. The mount mechanism 10 is applicable to various types of inspection apparatus for inspecting the electrical characteristics of IC formed on the object, an example of which is a semiconductor wafer. In the descriptions below, reference will be made only to the mount mechanism, and the entire inspection apparatus provided with the mount mechanism will not be described.

As shown in FIGS. 1 and 2, the mount mechanism of the embodiment is provided with: mount means (ex. A chuck top) 11 on which a wafer is mounted; support means (ex. a support table) 12 for supporting the chuck top 11 to be rotatable in normal and reverse directions; and rotating means (ex. a rotating mechanism) 13 for reversibly rotating the chuck top 11 on the support table 12 in the θ direction. Inside the probing chamber of the inspection apparatus, the mount mechanism is movable back and forth along an X-Y guide rail (not shown), and is vertically movable in the Z direction (i.e., in the vertical direction). Preferably, the chuck top 11 is made up of upper and lower plates 111 and 112 having the same outer diameter, and a ring-shaped plate 113 interposed between the upper and lower plates 111 and 112. The plates 111 and 112 can be formed of aluminum, and the ring-shaped plate 113 can be formed of a ceramic material. It is preferable that the ring plate 113 be used as a heat insulator for shutting off the thermal conduction between the upper and lower plates 111 and 112, i.e. for preventing thermal conduction from the chuck top 11 to the support table 12. The outer diameter of the ring plate 113 may be the same as that of the plates 111 and 112. The inner diameter of the ring plate 113 is preferably determined in such a manner as to provide a space where part of lift guide means (ex. a vertical movement guiding mechanism) (to be described below) is installed. The support table 12 comprises a support plate 121 and a cylindrical member 122 coaxial with the support plate 121. Where the cylindrical member 122 has a large diameter, the support table can be supported in a stable manner.

A vacuum suction mechanism 14 and a vertical driving mechanism 15 are provided for the upper surface of the support table 12. The vacuum suction mechanism 14 fixes the chuck top 11 to the upper surface of the support table 12 by a vacuum suction force. The vertical driving mechanism 15 supplies air into a gas supply passage 15B when the vacuum suction force provided by the vacuum suction mechanism 14 is released or reduced. Due to the force produced by the supplied air, the chuck top 11 floats slightly away from the support table 12. As shown in FIG. 1, a plurality of vacuum section mechanisms 14 and vertical driving mechanisms 15 are alternately provided in the neighborhood of the outer periphery of the upper surface of the support table 12 in such a manner that they are arranged in the circumferential direction (e.g., at three positions determined in the circumferential direction).

As shown in FIGS. 1 and 2, the vacuum suction mechanism 14 comprises: a projected wall section 14A which is provided on the upper surface of the support table 12 in such a manner as to form a fan shape; and a vacuum exhaust passage 14B which is formed in the central portion of the projected wall section 14A. The vacuum exhaust passage 14B is connected to a vacuum exhaust apparatus (not shown) through a vacuum pipe (not shown). In the state where the upper end of the projected wall section 14A is in contact with the lower surface of the chuck top 11, a sealed space is defined. When a vacuum is drawn through the vacuum exhaust passage 14B, the sealed space provides a pressure-reduced space. The vertical driving mechanism 15 need not be limited to the structure utilizing compressed air; it may be realized as a mechanism utilizing magnetism or a mechanism utilizing both compressed air and magnetism. When compressed air is utilized, the vertical driving mechanism 15 comprises a support table 12, a projected section 15A formed on the support table 12, and a gas supply passage 15B which is formed in the projected section 15A to supply compressed air. This projected section has the same height as the projected wall section 14A, and comprises a projected flat portion having the same outer shape as the projected wall section 14A. The projected section 15A and the projected wall section 14A can be formed by attaching required components to the support table 121 or working the upper surface of the support table 121. The gas supply passage 15B is connected to a compressed air-supply source (not shown) through an air pipe (not shown). The projected flat portion 15A has a groove 15C and a gas supply passage 15B. The compressed air from the gas supply passage 15B flows through the groove 15C and serves to make the chuck top 11 afloat. Preferably, the groove 15C is very shallow and in the shape of a cross. The gas supply passage 15B can be provided at the intersection of the cross-shaped groove 15C.

For alignment of a wafer, the vacuum suction force by the vacuum suction mechanism 14 is released or reduced. Then, air is discharged from the vertical driving mechanism 15. The pressure provided by the air causes the chuck top 11 to rise away from the support table 12 in a floating state. When the chuck top 11 is in the floating state, the rotating mechanism 13 rotates the chuck top in the θ direction in a reversible fashion, for alignment. Thereafter, the supply of air from the vertical driving mechanism 15 is stopped, or air is drawn from the sealed space described above by way of the vacuum exhaust passage 14B of the vacuum suction mechanism 14. As a result, the chuck top 11 descends and lands on the projected wall section 14A and the projected flat portion 15A. The chuck top 11 is thus sucked and secured on the support table 12. Since the chuck top 11 of this structure does not have any sliding portions, no particle is produced.

As shown in FIG. 2, a vertical guide mechanism 16 is arranged between the chuck top 11 and the support table 12. When the vacuum suction mechanism 14 or the vertical driving mechanism 15 is operated, the chuck top 11 vertically moves along the vertical guide mechanism 16. As shown in the Figure, the vertical guide mechanism 16 comprises: an angular bearing 16A attached to the lower surface of the support table 12; a splined shaft 16B having a lower end rotatably supported by the angular bearing 16A; and an engagement member 16C fixed in the opening of the plate 112 of the chuck top 11 in such a manner that the splined shaft 16B is rotatably supported. The engagement member 16C has a splined guide on the inner surface thereof, and this splined guide is engageable with the splined shaft 16B. The engageable member 16C is fixed by means of a flange 16D fitted with the opening of the plate 112 of the chuck top 11. When the chuck top 11 moves, it is guided vertically along the splined shaft 16B by the engagement member 16C.

As shown, for example, in FIGS. 1 and 2, the rotating mechanism 13 comprises: a motor 13A secured inside the probing chamber; a driving shaft 13B reversibly rotated by the motor 13A; a movable member 13C moved by the driving shaft 13B; and a coupling mechanism 13H that couples the movable member 13C and the chuck top 11 together.

The driving shaft 13B is preferably a ball screw 13B, and the movable member 13C is preferably a nut. The coupling mechanism 13H may be made up of: an engagement groove 13D formed in the movable member; an engagement projection 13E loosely inserted in the engagement groove 13D and horizontally protruding from the outer circumference of the chuck top 11; a rotatable roller 13F located on one side of the engagement groove 13D; and a spring 13G. In this coupling mechanism, the engagement projection 13E is elastically clamped by the roller 13F and the spring 13G. In the embodiment described below, a ball screw 13B and a nut 13C are employed as the driving shaft 13B and the movable member 13C, respectively, and the coupling mechanism 13G is made up of the engagement groove 13D, engagement projection 13E, roller 13F and spring 13G described above.

According to this embodiment, the nut 13C is moved back and forth along the ball screw 13B when the ball screw 13B is reversibly rotated by the motor 13A. The back-and-forth movement is transmitted to the chuck top 11 through the coupling mechanism 13G, and the chuck top 11 is reversibly rotated in the θ direction, with the shaft 16B as a center (in the angular range of ±7° to 8°, for example). In this manner, alignment is executed with respect to the wafer held on the chuck top 11.

A description will be given of the operation of the mount mechanism shown in FIGS. 1 and 2. After being pre-aligned in the loading chamber 1, a wafer is transported into the probing chamber 2 (FIGS. 7 and 8). The wafer is mounted on the chuck top 11 of the mount mechanism 10 arranged inside the probing chamber 2. The mount mechanism (main chuck) 10 moves the chuck top 11 in the X and Y directions, so that alignment of the wafer is executed in the X and Y directions in cooperation with the alignment mechanism (FIG. 7). The rotating mechanism 13 reversibly rotates the chuck top in the θ direction, thereby executing alignment of the wafer in the θ direction.

The alignment in the θ direction will be described in more detail. When compressed air is supplied through the gas supply passage 15B of the driving mechanism 15, the compressed air causes the chuck top 11 to rise away from the support table 12. At the time, the chuck top 11 is guided by the splined shaft 16B and engagement member 16C of the vertical guide mechanism 16, and rises vertically and stays away from the support table 12 in a floating state. In this state, the rotating mechanism 16 is driven, and the chuck top 11 is reversibly rotated in the θ direction, for alignment in the θ direction. After alignment in the θ direction, the supply of air is stopped. As a result, the chuck top 11 descends vertically, while being guided by the vertical guide mechanism 16, until the lower surface of the chuck top 11 is brought into contact with both the projected wall section 14A of the vacuum suction mechanism 14 and the projected section 15A of the vertical driving mechanism 15. Since the projected wall section 14A and the projected section 15A are at the same level, the chuck top 11 is brought into tight contact with the projected wall section 14A and the projected flat portion 15A, thereby defining a sealed space inside of the projected wall section 14A of the vacuum suction mechanism 14. Air is discharged from inside the sealed space by way of the vacuum exhaust passage 14B. By so doing, the pressure in the sealed space is reduced, and the chuck top 11 is secured onto the upper surface of the support table 12 by the vacuum suction force. In this manner, the alignment of the chuck top 11 in the θ direction is completed.

After the alignment in the θ direction, the mount mechanism 10 is over-driven upward in the vertical direction. The probe needles are brought into contact with the electrodes of integrated circuits formed on the wafer, and the great needle pressure of the probe needle is applied to the wafer. Since the probe needles are brought into contact with the wafer at positions that are in the neighborhood of the outer circumference, the chuck top 11 does not slant even if an eccentric load is applied to the wafer. That is, the projected wall section 14A and/or the projected section 15A is located in the neighborhood of the outer circumference of the support table 12, and the chuck top 11 is kept in the horizontal state at all times. Unlike the chuck top of the conventional art, the chuck top 11 of the present invention does not slant, and the probe needles are not shifted from the respective alignment positions. Hence, reliable and stable inspection can be performed on the basis of the predetermined alignment positions.

As described above, according to the present embodiment, the vacuum suction mechanism 14 and the vertical driving mechanism 15 are provided on the upper surface of the support table and located in the neighborhood of the outer circumference. The vertical guide mechanism 16, which guides the vertical movement of the chuck top 11, is preferably arranged between the chuck top 11 and the support table 12. More preferably, when the chuck top 11 is attracted by the support table 12 by vacuum suction, the chuck top 11 is made to land on the projected wall section 14A of the vacuum suction mechanism 14 and/or the projected section 15A of the vertical driving mechanism 15. Since the probe needles are brought into contact with the outer circumferential portions of the wafer, the chuck top 11 can be kept in the horizontal state at all times even if an eccentric load is applied to the wafer. As a result, the probe needles are prevented from being shifted from the predetermined alignment positions, and the reliability of the inspection is enhanced, accordingly. In addition, the chuck top 11 is rotated in the floating state at a position away from the support table 12, and the angular bearing 16A, which is a sliding portion, is within the cylindrical member 122. Hence, dust is not diffused. Since the probing chamber in which inspection is performed contains a reduced number of particles, the wafer contamination due to the particles is suppressed.

Figure 3:
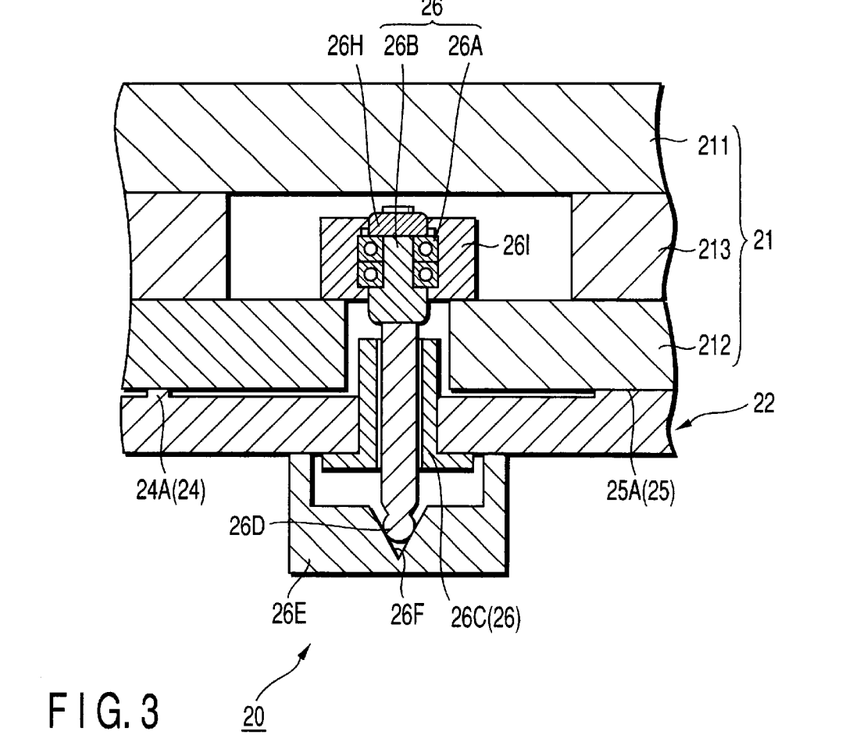
FIG. 3 is a sectional view showing the major portion of the mount mechanism according to another embodiment of the present invention.

FIG. 3 is a sectional view showing the major portion according to another embodiment of the present invention. The mount mechanism 20 of this alternative embodiment differs from the mount mechanism 10 described above in the structure of the vertical guide mechanism 26 it employs. As shown in FIG. 3, the vertical guide mechanism 20 comprises: an angular bearing 26A fixed to the top surface of the chuck top 21; a splined shaft 26B whose upper end portion is rotatably supported by the angular bearing 26A and a nut 26H; and an engagement member 26C which is fixed to the support table 22 in a state where it is in engagement with the key of the splined shaft 26B. Reference symbol 26I denotes a block for making the angular bearing 26A immovable. The engagement member 26C and the splined shaft 26B are similar to those of the above embodiment. A ball portion 26D is at the lower end of the splined shaft 26B. The ball portion 26D is in contact with a reverse-conical depression 26F formed in a positioning member 26E, which is attached to the lower surface of the support table 22.

When the chuck top 21 is moved up, it is guided by the splined shaft 26B and the engagement member 26C so that it is raised vertically. When the chuck top 21 is moved down, it is likewise guided by the splined shaft 26B and the engagement member 26C so that it is lowered vertically. When the chuck top 21 is moved down, the ball portion 26D at the end of the splined shaft 26B is guided into the depression 26F of the positioning member 26E. In this manner, the chuck top 21 is reliably positioned with reference to the axis.

Figure 4:
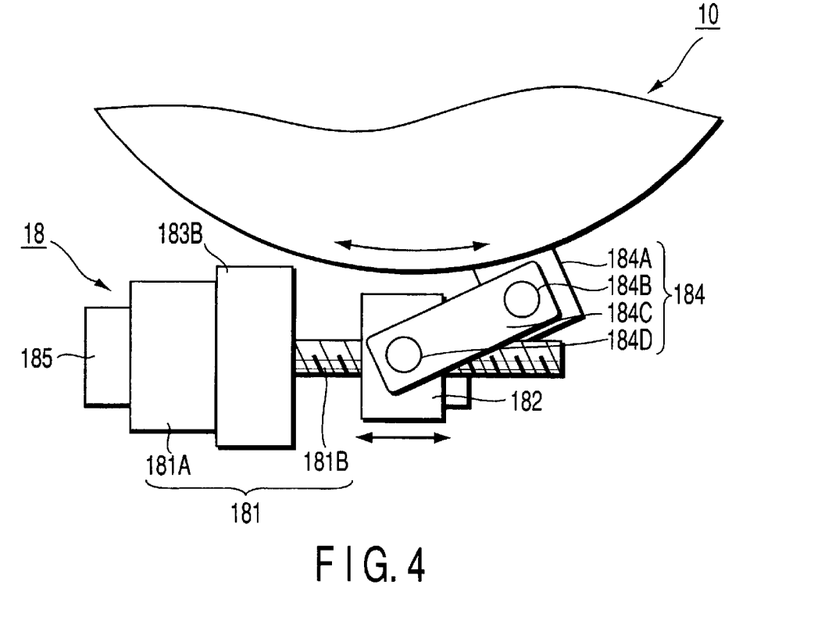
FIG. 4 is a plan view showing a rotating mechanism according to one embodiment of the present invention.
Figure 5A:
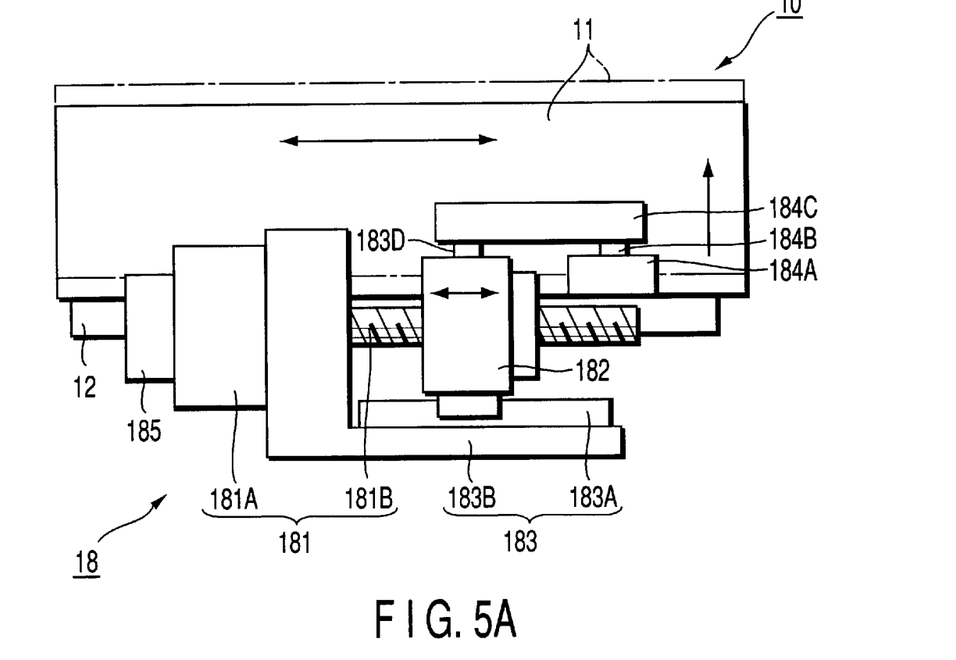
FIG. 5A is a side view of the rotating mechanism shown in FIG. 4.
Figure 6:
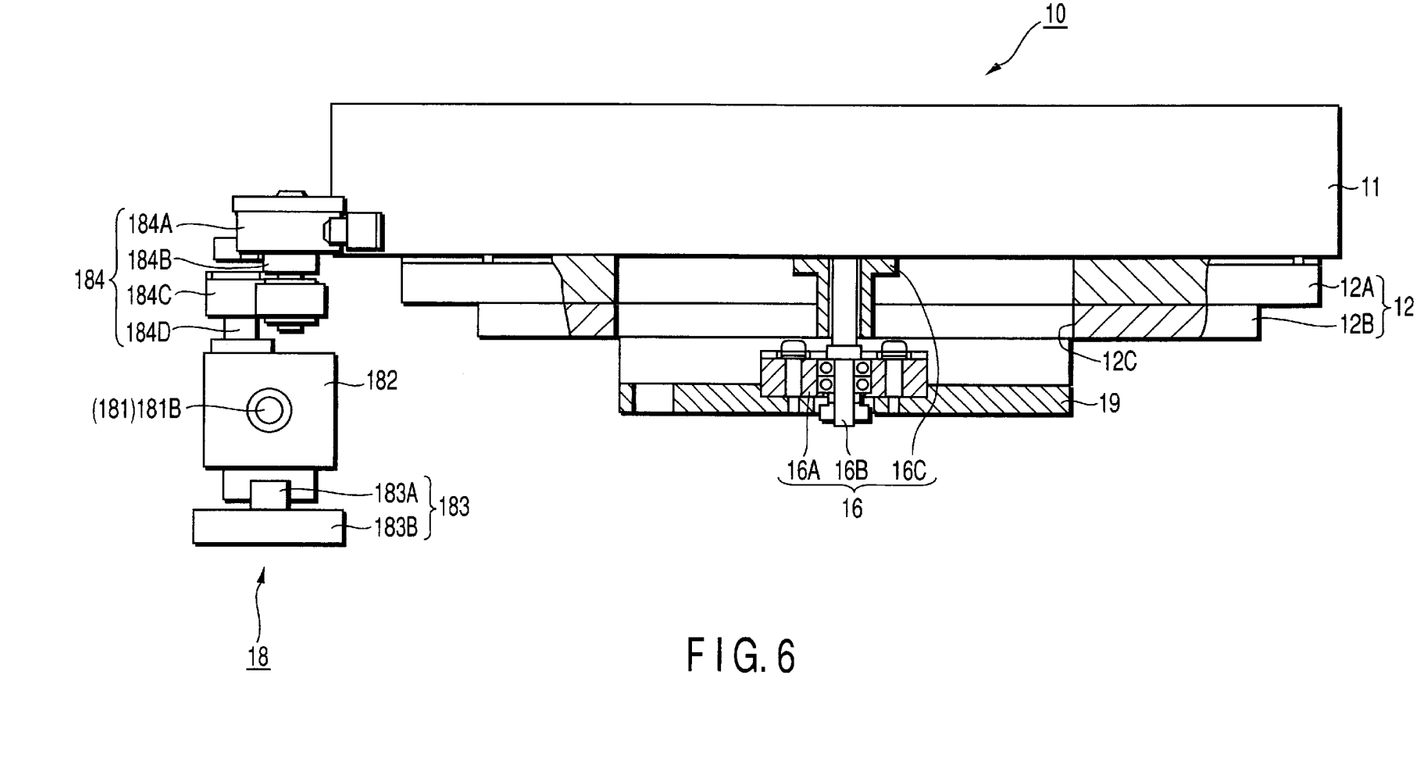
FIG. 6 is a sectional view showing the major portion of the mount mechanism which is according to one embodiment of the present invention and to which the rotating mechanism shown in FIG. 4 is applied.

FIGS. 4 through 6 illustrate an embodiment of the mount mechanism that employs the rotating mechanism of the present invention. As shown in FIGS. 4 through 6, the mount mechanism 10 of the embodiment comprises a chuck top 11, a support table 12, a vertical guide mechanism 16 and a rotating mechanism 18. The mount mechanism of the embodiment differ from that shown in FIGS. 1 and 2 in light of the structures of the support table 12 and rotating mechanism 18 it has. As shown in FIG. 6, the support table 12 is provided with a θ table 12A and a base plate 12B. Although not shown, the support table 12 is provided with a vacuum suction mechanism and a vertical driving mechanism, which are similar to those described above. As shown in FIG. 6, a hole 12C is formed in the center of the support table 12, and a plate center 19 is arranged to be horizontal at a position slightly lower than the hole 12C. The vertical guide mechanism 16 is arranged on this plate center 19. Being guided by the vertical guide mechanism 16, the chuck top 11 on the support table 12 is vertically moved for a short distance. As shown, for example, in FIG. 6, the vertical guide mechanism 16 is provided with: an angular bearing 16A provided in the center of the plate center 19; a splined shaft 16B; and an engagement member 16C. When the chuck top 11 is being aligned in the θ direction, the splined shaft 16B vertically moves along the linear guide hole of the engagement member 16C. Being guided by the vertical movement of the splined shaft 16B, the chuck top 11 is moved up or down on the support table 12.

As shown, for example, in FIGS. 4 through 6, the rotating mechanism 18 is provided with: a linear driving mechanism 181 arranged on a side of the chuck top 11; a movable member 182 linearly moved by the linear driving mechanism 182; a linear guide mechanism 183 for linearly guiding the movable member 182; and a link mechanism 184 for coupling the movable member 182, which is guided and moved by the linear guide mechanism 183 to the chuck top 11. The rotating mechanism 18 controls the moving distance of the movable member 182, i.e., the rotating angle of the chuck top 11, with high accuracy, by means of an encoder 185 and a control device (not shown). The encoder 185 is provided for the motor 181A of the linear driving mechanism 181.

The linear driving mechanism 181 is provided with: the motor 181A fixed to the support table 12; and a ball screw 181B coupled to the motor 181A. A movable member 182 (namely, a nut 182) is threadably engaged with the ball screw 181B. When the ball screw 181B is reversibly rotated by the motor 181A, the nut 182 is linearly moved to the right or to the left in the direction indicated by the arrows in FIGS. 4 and 5. The encoder 185 detects the number of rotations of the motor 181A (i.e., the number of rotations of the ball screw 181B) with high accuracy. On the basis of the detected value, the moving distance of the nut 182, i.e., the rotating angle of the chuck top 11, can be controlled with high accuracy.

Figure 5B:
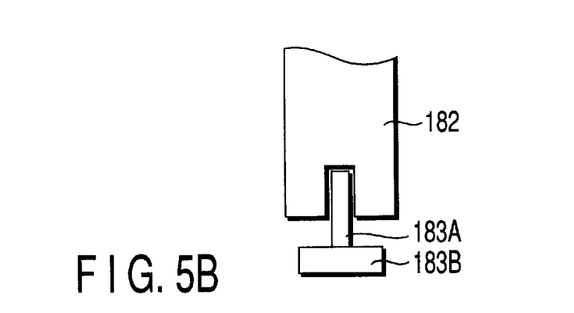
FIGS. 5B and 5C show an example of a linearly guiding mechanism which can be employed in the rotating mechanism shown in FIG. 5A.
Figure 5C:
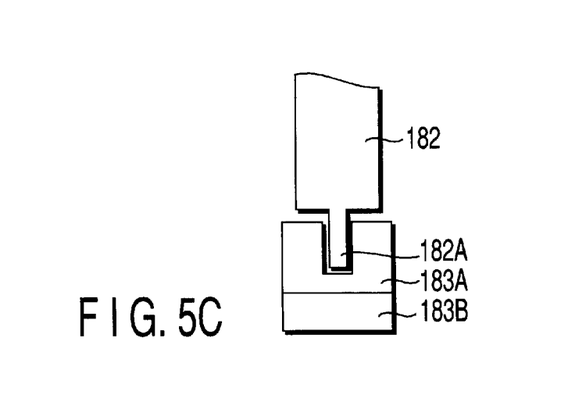

As shown in FIGS. 4 through 6, the linear guide mechanism 183 comprises a guide rail 183A and a support member 183B, both being arranged just under the ball screw 181B. The guide rail 183A is arranged in parallel to the ball screw 181B, and the support-member 183B is fixed to the motor 181A. An LM guide can be employed as the guide rail 183A. The bottom portion of the nut 182 and the guide mechanism of the guide rail 183A can be realized in a number of manners. FIGS. 5B and 5C show an example of a possible structure. The support member 183B supports the guide rail 183A, and the bottom portion of the nut 182 is in engagement with the guide rail 183A. Owing to the use of the guide rail 183A, the rigidity of the nut 182, which is linearly moved by the ball screw 181B, is improved, and the operating accuracy of the link mechanism 184 is enhanced.

An example of the link mechanism 184 is shown in FIGS. 4 and 5. The link mechanism 184 comprises: an engagement portion 184A fixed to the circumferential surface of the chuck top 11; a splined shaft 184B which is spline-coupled to the engagement portion 184A; a link device (ex. a link member) 184C coupled to the other end of the splined shaft 184B; and a support shaft 184D connected to the other end of the link member 184C and provided on the upper surface of the nut 182. The coupling portion of the link member 184C incorporates bearings (not shown), for example. By means of one bearing of the link member 184C, one end of the splined shaft 184B is rotatably supported. By another bearing of the link member 184C, the support shaft 184D can be rotatably supported. On the support table 12, the chuck top 11 can be moved up or down by the spline-coupling of the engagement portion 184A, which uses the splined shaft 184B.

For alignment of a wafer, the chuck top 11 floats and rises. The nut 182 moves right and left, with a swinging motion being prevented by the ball screw 181B and the guide rail 183A. The movement of the nut 182 is transmitted to the chuck top 11 through the link mechanism 184. As indicated by the arrows in FIGS. 4 and 5, the chuck top 11 is reversibly rotated in the θ direction (in the angular range of ±7° to 8°, for example). In this manner, alignment is executed with respect to the wafer.

A description will be given of the operation of the mount mechanism shown in FIGS. 4 through 6. On the chuck top 11 of the mount mechanism 10 provided inside the probing chamber (FIG. 7), a wafer is placed after being pre-aligned. The mount mechanism 10 is movable in the X and Y directions, and the wafer on the mount mechanism 10 is aligned in the X and Y directions in cooperation of the alignment mechanism (not shown). The chuck top 11 is reversibly rotated in the θ direction by the rotating mechanism 18, thereby aligning the wafer in the θ direction. When alignment is executed in the θ direction, the vertical driving mechanism of the chuck top 11 is driven, and the chuck top 11 floats and rises from the solid line position to the one-dot-dash line position in FIG. 5 while being guided by the splined shaft 16B and engagement member 16C of the vertical guide mechanism 16. When the chuck top lifts off the support table 12, the engagement portion 184A is raised by the spline-coupling to the link mechanism 184. In this state, the rotating mechanism 18 is driven.

Under the control by the encoder 185 and the control device, the moving distance of the nut 182 of the linear driving mechanism 181 can be controlled with high accuracy based on the movement of the ball screw 181B. In this controlled state, the nut 182 moves linearly while being guided by the guide rail 183A. At the time, the link mechanism 184 converts the linear motion of the nut 182 into rotation of the chuck top 11. The chuck top 11 is therefore rotated in the θ direction, and the wafer is aligned in the θ direction thereby. After the end of this alignment, the chuck top 11 is lowered by the vertical driving mechanism and fixed to the support table 12 by a vacuum suction force. When the chuck top 11 is raised and over-driven, the probe needles are brought into contact with the wafer placed on the chuck top 11. At the time of this contact, an eccentric load is applied from the probe needles to the chuck top 11, and a torque acting in the θ direction is applied to the chuck top 11. The rigidity which the chuck top 11 has in the θ direction is remarkably enhanced due to the use of the guide rail 183A and the link mechanism. Hence, the chuck top 11 is not much rotated in the θ direction. The probe needles and the electrode pads can come into contact with each other, and the predetermined electric inspection can be executed reliably. The rotating mechanism 18 converts a linear motion of the nut 182 into a rotating motion by means of the link mechanism 184, and this type of rotating mechanism does not occupy a wide space in comparison with the conventional type.

As described above, according to the present invention, the rotating mechanism is provided with: a motor arranged on one side of the chuck top; a driving shaft driven by the motor; a movable member which is linearly movable; an LM guide for linearly guiding the movable member; and a link mechanism 184 for coupling the linearly movable member to the chuck top. Owing to these structural elements, the rigidity the chuck top has in the θ direction is enhanced remarkably. Even if the chuck top is exerted with a torque acting in the θ direction when the wafer is inspected, the chuck top is reliably prevented from rotating in the θ direction. A θ-direction positional shift of the chuck top is thus reliably prevented. Since the rotating mechanism converts a linear motion into a rotating motion by means of a link mechanism, the space occupied by the rotating member is small in comparison with the corresponding space according to the prior art. Accordingly, the space required for the mount mechanism can be as small as possible.

According to the present embodiment, the mount mechanism is provided with the rotating mechanism, and, owing to this structure, the rigidity which the chuck top has in the θ direction is enhanced remarkably. Even if a θ-direction torque is applied to the chuck top during the inspection of a wafer, a θ-direction rotation of the chuck top is reliably prevented. Since a θ-direction positional shift of the chuck top is reliably prevented, the reliability of the inspection increases.

In relation to each of the above embodiments, the chuck top 11, 21 is described as landing on the vacuum suction mechanism 14, 24 and the vertical driving mechanism 15, 25 that are arranged in the neighborhood of the outer circumference of the support table 12, 22. In place of this structure, a projection, which is different from the vacuum suction mechanism 14, 24 and the vertical driving mechanism 15, 25, may be provided in the neighborhood of the outer circumference of the support table so that the projection extends throughout in the circumferential direction. In other words, the vacuum suction mechanism and the vertical driving mechanism are merely required to attain their original functions, and any types of mount mechanism wherein the chuck top is vertically movable on the support table along the vertical guide mechanism are encompassed by the present invention.

The embodiments were described, referring to the case where a rotating mechanism is provided for structural elements other than a mount mechanism. However, the rotating mechanism may be provided directly for the mount mechanism. If this structure is adopted, the installation space can be reduced further. In other words, the present invention encompasses any types of mechanism wherein a rotating mechanism is made up of a movable linear guide mechanism and a link mechanism, and wherein the rigidity of the portion between the chuck top and the rotating mechanism can be enhanced.

The rotating mechanism of the present invention has a feature that the rigidity the chuck top has in the θ direction is enhanced. The chuck top is reliably prevented from unnecessarily rotating in the θ direction, and the reliability of the inspection is enhanced, accordingly.

The mount mechanism of the present invention has a feature that the chuck top is kept in the horizontal state even if, at the time of inspection, a load is eccentrically applied to the chuck top at a position in the vicinity of the outer circumference. Owing to this feature, the reliability of the inspection is increased.

According to the present invention, it is possible to provide a mount mechanism which is adapted for an object to be inspected and which has the advantages described and claimed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mount mechanism for mounting an object to be inspected, comprising:
   a chuck top on which the object is mounted;
   a support table for supporting the chuck top to be rotatable in normal and reverse directions, said support table being provided with a vacuum suction mechanism having a vacuum exhaust passage which sucks and fixes the chuck top on the support table by a vacuum force;
   a rotating mechanism for rotating the chuck top on the support table in normal and reverse directions; and
   wherein the support table is provided with a lift guide mechanism that has a gas supply/exhaust passage, said gas supply/exhaust passage being for enabling the chuck top to float away from the support table by utilization of a gas pressure, and for enabling the chuck top to land on the support table by releasing the gas pressure.

2. A mount mechanism according to claim 1, wherein:
   said vacuum suction mechanism includes: a projected wall section arranged on the upper surface of the support table, being in contact with the lower surface of the chuck top, and defining a sealed space with reference to the upper surface of the support table and the lower surface of the chuck top; and a vacuum exhaust passage which is open in the upper surface of the support table at a position inside of the projected wall section, and
   said lift mechanism includes a projection formed on the upper surface of the support table, and an air supply passage which is open in the projection.

3. A mount mechanism according to claim 2, wherein at least one of the vacuum suction mechanism and lift mechanism is provided as said projection.

4. A mount mechanism according to claim 2, wherein said vacuum suction mechanism and said lift mechanism are arranged at equal intervals with respect to the circumferential direction of the support table.

5. A mount mechanism according to claim 1, wherein a projection is provided close to an outer circumstance of an upper surface of the support table, said chuck top being landed on the projection when the chuck top is attracted by vacuum suction.

6. A mount mechanism according to claim 1, wherein said lift guide mechanism includes:
   a shaft supported by one of the chuck top and the support table; and
   an engagement member secured to a remaining one of the chuck top and support table and being in engagement with the shaft in such a manner that the shaft is vertically movable.

7. A mount mechanism according to claim 1, wherein said lift guide mechanism includes:
   a splined shaft which is supported by one of the chuck top and the support table to be reversibly rotatable; and
   an engagement member secured to a remaining one of the chuck top and support table and being movable in engagement with the splined shaft.

8. A mount mechanism according to claim 1, wherein said rotating mechanism includes:
   a movable body;
   a linearly driving mechanism for linearly moving the movable body on a side of the chuck top;
   a guide mechanism including a guide rail for linearly guiding the movable body; and
   a coupling mechanism for coupling the movable body and the chuck top together and converting a linear motion of the movable body into a rotating motion of the chuck top.

9. A mount mechanism according to claim 8, wherein:
   the driving shaft of the rotating mechanism is a ball screw;
   the movable body of the rotating mechanism is provided with a through hole having a groove that is engageable with the ball screw; and
   the coupling mechanism of the rotating mechanism is a link device which is coupled to the chuck top and the movable body at respective ends.

10. A mount mechanism according to claim 9, wherein the guide rail of the rotating mechanism is an LM guide that is engageable with the lower portion of the movable body.

11. A mount mechanism according to claim 8, wherein:

the driving shaft of the rotating mechanism is a ball screw;

the movable body of the rotating mechanism is provided with a through hole having a groove that is engageable with the ball screw; and said coupling mechanism includes a splined shaft having one end connected to the chuck top, a link having one end connected to another end of the splined shaft, and a support shaft coupled to another end of the link device and standing upright on the movable body.

12. A mount mechanism according to claim 11, wherein the guide rail of the rotating mechanism is an LM guide that is engageable with the lower portion of the movable body.

13. A mount mechanism according to claim 8, wherein the guide rail of the rotating mechanism is an LM guide that is engageable with the lower portion of the movable body.

* * * * *